United States Patent [19]

Cina et al.

[11] Patent Number: 5,042,709

[45] Date of Patent: Aug. 27, 1991

[54] METHODS AND APPARATUS FOR PRECISE ALIGNMENT OF OBJECTS

[75] Inventors: Michael F. Cina, Hopewell Junction; Mitchell S. Cohen, Ossining; Ephraim B. Flint, Garrison; Kurt R. Grebe, Beacon; Douglas J. Hall, Newark Valley, all of N.Y.; Kenneth P. Jackson, Danbury, Conn.; Modest M. Oprysko, Mahopac, N.Y.

[73] Assignee: International Business Machines Corporation, Armonk, N.Y.

[21] Appl. No.: 542,271

[22] Filed: Jun. 22, 1990

[51] Int. Cl.$^5$ .............................................. H05K 3/34
[52] U.S. Cl. ................................. 228/105; 228/44.7; 228/49.1; 29/833; 29/834
[58] Field of Search ............. 228/105, 44.7, 49.1, 228/179, 180.2, 4.5; 29/833, 834

[56] References Cited

U.S. PATENT DOCUMENTS

| | | | |
|---|---|---|---|
| 3,982,979 | 9/1976 | Hentz et al. | 228/105 |
| 4,404,741 | 9/1983 | Lebet et al. | 29/833 |
| 4,425,037 | 1/1984 | Hershel et al. | 355/43 |
| 4,451,324 | 5/1984 | Ichikawa et al. | 29/834 |
| 4,453,085 | 6/1984 | Pryor | 250/203 R |
| 4,476,626 | 10/1984 | Gumbert et al. | 29/834 |
| 4,528,451 | 7/1985 | Petric et al. | 250/441.1 |
| 4,560,880 | 12/1985 | Petric et al. | 250/441.1 |
| 4,570,065 | 2/1986 | Pryor | 250/231 R |
| 4,633,079 | 12/1986 | Rieger | 250/227 |
| 4,670,981 | 6/1987 | Kubota et al. | 29/834 |
| 4,699,515 | 10/1987 | Tanimoto et al. | 356/40 |
| 4,761,561 | 8/1988 | Fujiwara et al. | 250/548 |
| 4,766,322 | 8/1988 | Hashimoto | 250/561 |
| 4,775,281 | 10/1988 | Prentakis | 414/416 |
| 4,776,088 | 10/1988 | Biggs et al. | 29/834 |
| 4,788,440 | 11/1988 | Pryor | 250/561 |
| 4,792,693 | 12/1988 | Yamaguchi et al. | 250/548 |
| 4,793,707 | 12/1988 | Hata et al. | 356/375 |
| 4,816,728 | 3/1989 | Kurakake | 318/568 |
| 4,823,014 | 4/1989 | Miyawaki | 250/561 |

*Primary Examiner*—Samuel M. Heinrich
*Attorney, Agent, or Firm*—Daniel P. Morris

[57] ABSTRACT

Methods and apparatus are set forth for passively and precisely aligning pairs of objects, in particular, microelectronic components such as semiconductor lasers and fibers, utilizing fiducial marks. Additionally, methods and apparatus are set forth for combining passive and active alignment techniques where high degrees of alignment precision are required. Still further, techniques are described for fixing prealigned objects, independent of how the objects are prealigned, to a mounting surface in a manner that maintains the relative (aligned) position of the objects. Further yet, in order to help minimize manufacturing costs with respect to production of, for example, microelectronic assemblies, batch processing techniques are described which utilize the novel alignment procedures contemplated by the invention.

52 Claims, 10 Drawing Sheets

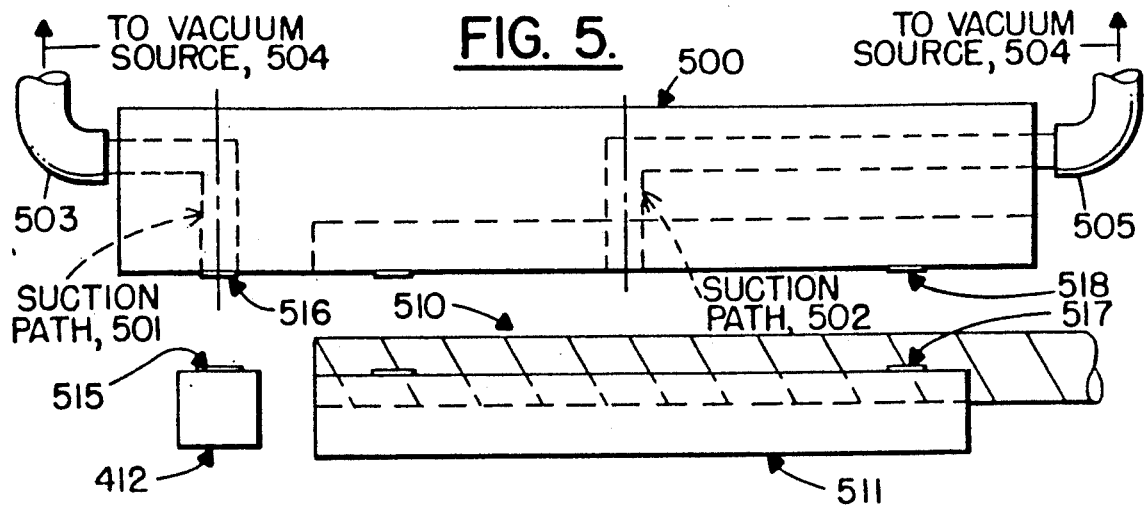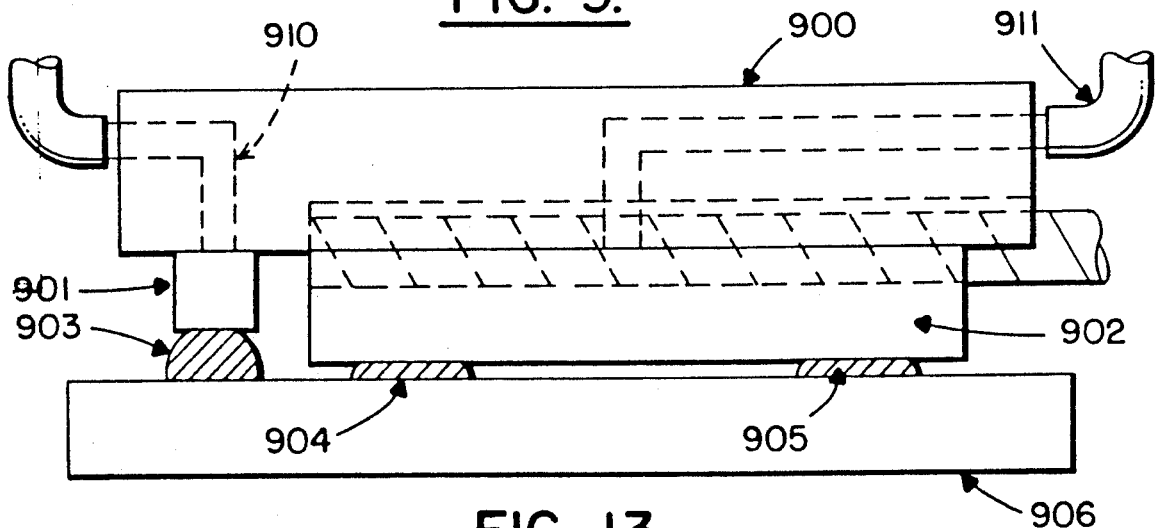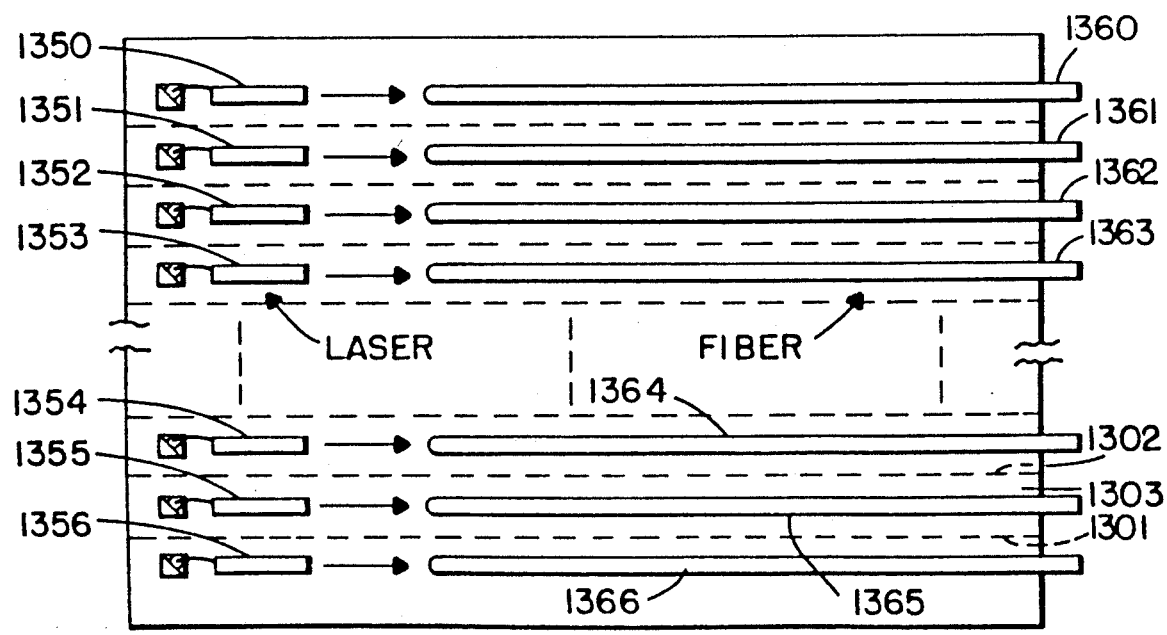

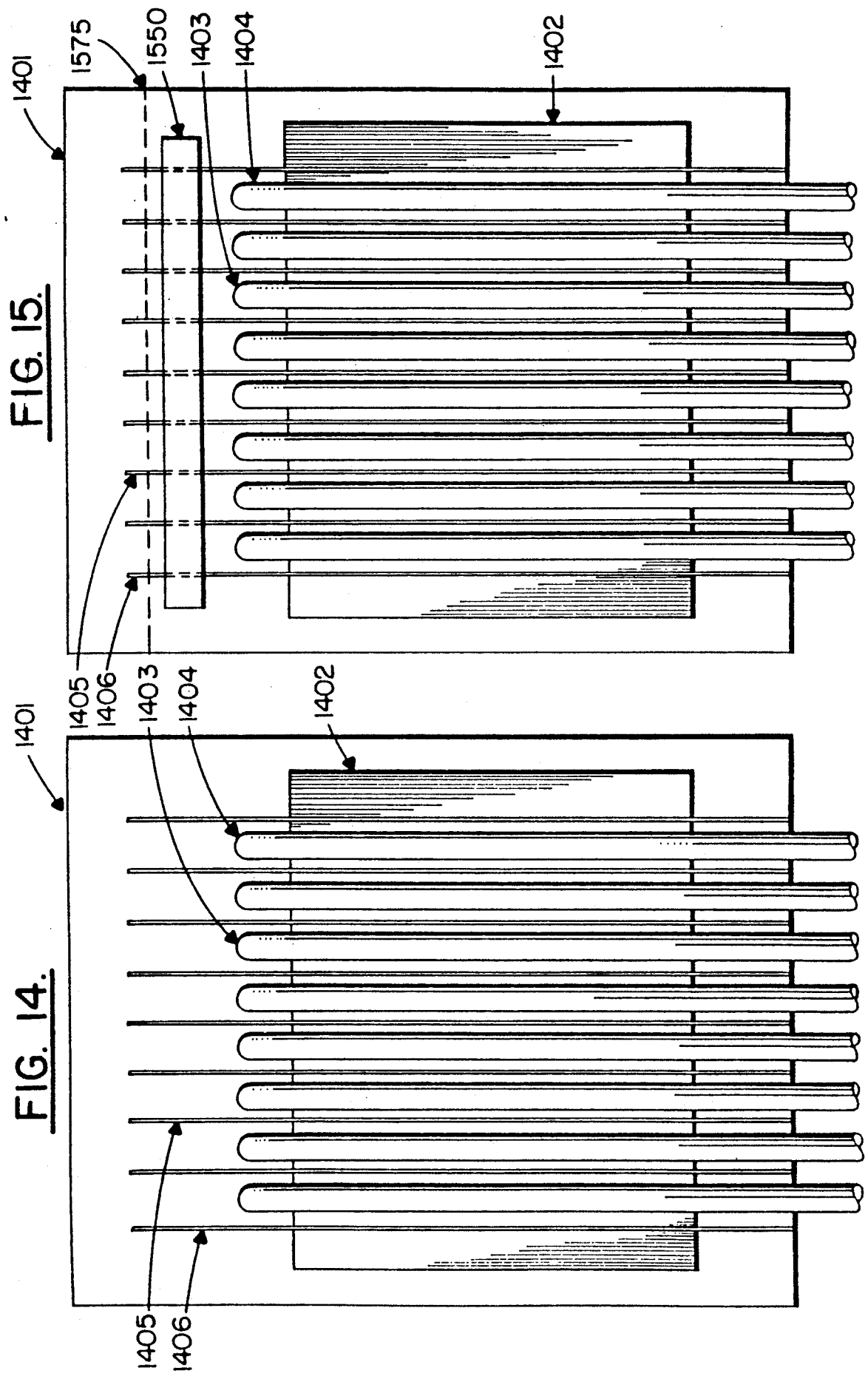

METHODS AND APPARATUS FOR PRECISE ALIGNMENT OF OBJECTS

BACKGROUND OF THE INVENTION

1. Field of the Invention

The invention relates generally to methods and apparatus for precisely aligning objects, such as solid state lasers and optical fibers, and permanently fixing aligned objects (independent of the technique used to perform the alignment) in a precise relationship to one another. More particularly, the invention relates to (a) methods and apparatus which use fiducial marks to align objects in a precise manner, and (b) methods and apparatus which facilitate fixing prealigned objects to a mounting device after first temporarily affixing the objects to another fixture. The invention provides for the "passive" alignment of objects, alignment using a combination of passive and "active" alignment techniques, and the ability to align objects so as to permit batch processing of a multiplicity of objects.

The terms "passive" and "active" as used herein qualify whether the alignment technique being utilized requires the activation of any component being aligned. Thus, for example, a "passive" technique for aligning a laser and a fiber would not require the laser to be turned on during the alignment process; whereas an "active" technique would require that the laser be turned on.

2. Description of the Related Art

Many prior art techniques exist for aligning a pair of objects. For example, U.S. Pat. No. 4,404,741, to Lebet et al, teaches methods and apparatus for aligning a part to a substrate. The substrate is disposed onto an X-Y table which is in turn disposed onto a surface over which it can slide to align the substrate with the part. The part is optically viewed when it and the substrate are being aligned.

Another technique for aligning an object (or parts) onto a substrate (and ultimately affixing the part thereto) is taught in U.S. Pat. No. 4,476,626, to Gumbert et al, which describes apparatus for transferring leadless components from a carrier to a given mounting position on a circuit board utilizing a punch and a suction pickup arrangement.

Yet another prior art technique for mounting electronic components onto predetermined positions on a circuit board is taught in U.S. Pat. No. 4,670,981, to Kubota et al. In this reference positioning of the parts is achieved by aligning suction pickup tubes to a predetermined location on the parts which are held in cavities in a jig.

All of the references cited hereinabove are examples of prior art concerned with aligning individual objects (such as electronic parts) to positions on a circuit board or substrate; rather than first aligning the objects to one another and then attempting to mount the objects (while maintaining their relative alignment) onto a mounting surface.

Still another technique for mounting objects onto a substrate is taught in U.S. Pat. No. 3,982,979, to Hentz et al. This patent describes an apparatus and method for positioning a plurality of semiconductor devices onto a substrate by feeding the parts through tubular rings. Using the techniques taught in Hentz et al, several hundreds of objects may be simultaneously positioned and adhered to a substrate.

Although dealing with the mounting and aligning of a plurality of objects on a substrate, the Hentz et al patent, like the other patents cited hereinbefore, does not deal with precisely aligning pairs of objects prior to positioning and mounting them on the substrate. Such an alignment capability would be particularly useful in assuring that optical components, e.g., solid state (e.g., GaAs) lasers and fibers, are properly aligned, and remain properly aligned, when being affixed to a mounting surface.

Still other inventions, such as those directed to determining the accuracy of placement of objects on a substrate (as in U.S. Pat. No. 4,776,088, to Biggs et al), describe techniques which use glass plates with marks (patterns) thereon to check the accuracy of the placement of objects by a placement apparatus.

Patterns are also used by Tanimoto et al, in U.S. Pat. No. 4,699,515, which describes an exposure apparatus for manufacturing semiconductor devices. A pattern on a photomask is aligned with a plurality of patterns formed on a wafer in a manner that detects and corrects misalignment between the photomask and wafer, and between the photomask and individual chips on the wafer.

Tanimoto et al is an example of a common method of aligning objects with high precision called "contact" lithography. As applied to semiconductor processing, contact lithography involves aligning a glass mask to a part, typically a patterned silicon wafer, to an accuracy better than one micrometer. The usual method of accomplishing this alignment involves the use of corresponding fiducial, i.e. registration, marks (patterns) on both the glass mask and the wafer; the mask is moved relative to the wafer until the fiducial marks are correctly positioned with respect to each other. Both fiducial marks are observed through the transparent glass mask during the alignment process with the aid of a suitable microscope.

Among the many possible fiducial marks are crosses, for example, a solid cross on the mask which may be aligned to a hollow cross on a wafer; and other patterns, such as those depicted in FIG. 5 of the Tanimoto et al reference. Cross type patterns may be "nested" so that when they are in perfect alignment symmetric gaps between the solid and hollow crosses may be observed. Since small differences in such gaps are easily detected, the alignment may be carried out in a highly precise fashion.

As indicated hereinabove, it is sometimes desirable (and/or necessary) to first align small parts with great precision, and then later to fix the positions of these parts so that their relative alignment does not subsequently change. The specific example cited hereinbefore, deals with optoelectronic components. It is often desirable to carry out such an operation quickly and automatically, so that the alignment and subsequent fixing can be accomplished at low manufacturing costs.

It is currently common practice to carry out the alignment of optoelectronic components such as solid state lasers and fibers, "actively", i.e., by turning on the laser and moving the fiber relative to it until the light output through the fiber is maximized. A fiducial mark alignment scheme would permit alignment in a highly precise fashion with the laser off, i.e., this scheme would provide "passive" alignment which is considerably cheaper than active alignment.

Accordingly, it would be desirable to provide a highly precise (in the micrometer range) passive alignment technique, suitable for aligning pairs of objects, in particular, optoelectronic components, prior to mounting the objects on a mounting surface.

It would also be desirable to provide methods and apparatus which combine both passive and active alignment techniques, in order to achieve an even higher degree of precision when aligning parts, as required by some applications, prior to mounting the parts. In particular, it would be desirable to be able to combine the active alignment techniques described hereinabove, with passive (fiducial mark based) alignment techniques, to, for example, first obtain an intermediate state of alignment (using the passive technique), with active alignment being reserved for a final adjustment step.

As for fixing aligned parts (independent of the way they are aligned), the prior art customarily employs methods which involve either cementing, e.g., by use of epoxy, or soldering. In either case there is a danger that the parts can move during the setting of the cement or, the freezing of the solder. The soldering process also carries with it the potential for degrading the performance characteristics of heat sensitive components, such as lasers.

Accordingly, it would be desirable to be able to ameliorate the problem of permanently fixing aligned objects without disturbing their relative positions, independent of the method used to achieve the initial alignment and without unnecessary heating of the objects.

In addition to all of the above, it would be desirable to provide batch processing techniques for optoelectronic components, wherein a multiplicity of parts was simultaneously aligned and subsequently separated; in this batch processing procedure the teachings set forth herein would be utilized in order to help keep manufacturing costs to a minimum.

SUMMARY OF THE INVENTION

It is an object of the invention to provide a highly precise (in the micrometer range) passive alignment technique, suitable for aligning pairs of objects, in particular, optoelectronic components, prior to mounting the objects onto a mounting surface.

It is a further object of the invention to provide passive alignment techniques for aligning pairs of objects (prior to mounting the objects), in particular optoelectronic components, based on the use of fiducial marks.

It is still a further object of the invention to provide methods which combine both passive and active alignment techniques in order to achieve an even higher degree of precision when aligning parts (prior to permanently fixing the parts on a mounting surface) as required by some applications.

Still further, it is an object of the invention to provide a method for permanently fixing aligned objects with minimal disturbance of their relative positions, independent of the method used to achieve the initial alignment and without unnecessarily heating the objects.

Further yet, it is an object of the invention to provide techniques for performing the alignment of a plurality of pairs of objects to permit batch processing utilizing the alignment techniques for pairs of objects taught herein.

According to the invention, methods and apparatus are set forth which provide for the passive alignment of pairs of objects (such as the passive alignment of an edge-emitting semiconductor laser and a fiber) and for permanently affixing the objects to a mounting surface with little disturbance of their relative (aligned) positions with respect to each other. The techniques involved are easily generalized for use in aligning an array of lasers and fibers in a batch process, and for use in combination with active alignment techniques.

In accordance with one embodiment of the invention, the apparatus comprises (a) an alignment plate of transparent material having at least one alignment location, wherein the alignment location has marks for the object positions (e.g., marks for the laser and marks for the fiber positions); (b) means for aligning the plate marks to corresponding marks on the objects; (c) means for temporarily holding the objects (e.g., via a vacuum) in position to provide precise alignment between the objects; (d) means for aligning a third set of marks in the plate to marks on a mounting surface (e.g., substrate) to which the objects are to be fixed (for example, by soldering); and (e) means for fixing the aligned objects onto the mounting surface.

According to another embodiment of the invention, the apparatus set forth hereinabove is further combined with means for performing active alignment.

Furthermore, according to still another embodiment of the invention, a method is set forth for affixing prealigned objects to a mounting surface comprising the steps of (a) temporarily fixing the aligned objects to a fixture which is itself aligned over the mounting surface; (b) applying means for securing the objects to the mounting surface, to predetermined locations on the mounting surface; and (c) placing the prealigned objects in contact with the means for securing, to thereby fix the objects to the mounting surface.

Still further, batch processing techniques are set forth which, according to yet another embodiment of the invention, may be used for fabricating a multiplicity of optoelectronic modules (such as laser-fiber modules) based on the novel techniques (e.g., passive alignment using fiducial marks) set forth herein.

The invention features low cost methods for passively and precisely aligning microelectronic components; methods for combining passive and active alignment techniques where high degrees of precision are required; methods for fixing prealigned objects to a mounting surface and batch processing techniques to help keep manufacturing costs of microelectronic assemblies to a minimum.

These and other objects and features of the present invention, and the manner of obtaining them, will become apparent to those skilled in the art, and the invention itself will be best understood by reference to the following detailed description read in conjunction with the accompanying Drawing.

BRIEF DESCRIPTION OF THE DRAWING

FIG. 5 depicts a side view of the alignment plate depicted in FIG. 4 together with a laser chip and fiber carrier.

FIG. 9 illustrates the principles of fixation by soldering, suitable for use in accordance with the teachings of the invention, to fix precisely aligned objects on a mounting surface, independent of how the objects are aligned.

FIG. 13 illustrates, in accordance with the teachings of the invention, the basic principle of batch fabrication of modules of aligned pairs of objects, and more particularly, the batch fabrication of laser-fiber modules.

FIG. 14 illustrates the combination of a substrate and fiber carrier with sawed slots, i.e., the "comb" type of structure contemplated by one embodiment of the invention.

FIG. 15 depicts the position of the final saw cutouts, after soldering a laser bar, i.e., an elongated chip containing a multiplicity of semiconductor laser placed side by side, using the techniques described herein to fabricate laser-fiber modules in a batch process.

DETAILED DESCRIPTION

In order to illustrate the principles of the invention, the description set forth hereinafter will, for the most part, concentrate on methods and apparatus for aligning semiconductor lasers to fibers. However, those skilled in the art will readily appreciate that the methods and apparatus described may be more generally used to align other types of pairs of objects, whether or not they are optoelectronic components.

As indicated hereinbefore, it is sometimes necessary to align small parts (e.g., solid state lasers and fibers) with great precision, and then later fix the position of these parts so that their relative alignment does not change.

Also, as indicated hereinbefore, a common method of aligning objects to high precisions is found in contact lithography, where corresponding fiducial marks on both a glass mask and a wafer are used, with the mask being moved relative to the wafer until the fiducial marks are correctly positioned with respect to each other. Both fiducial marks are observed through the transparent glass mask during the alignment process with the aid of a suitable microscope.

Figure 1:
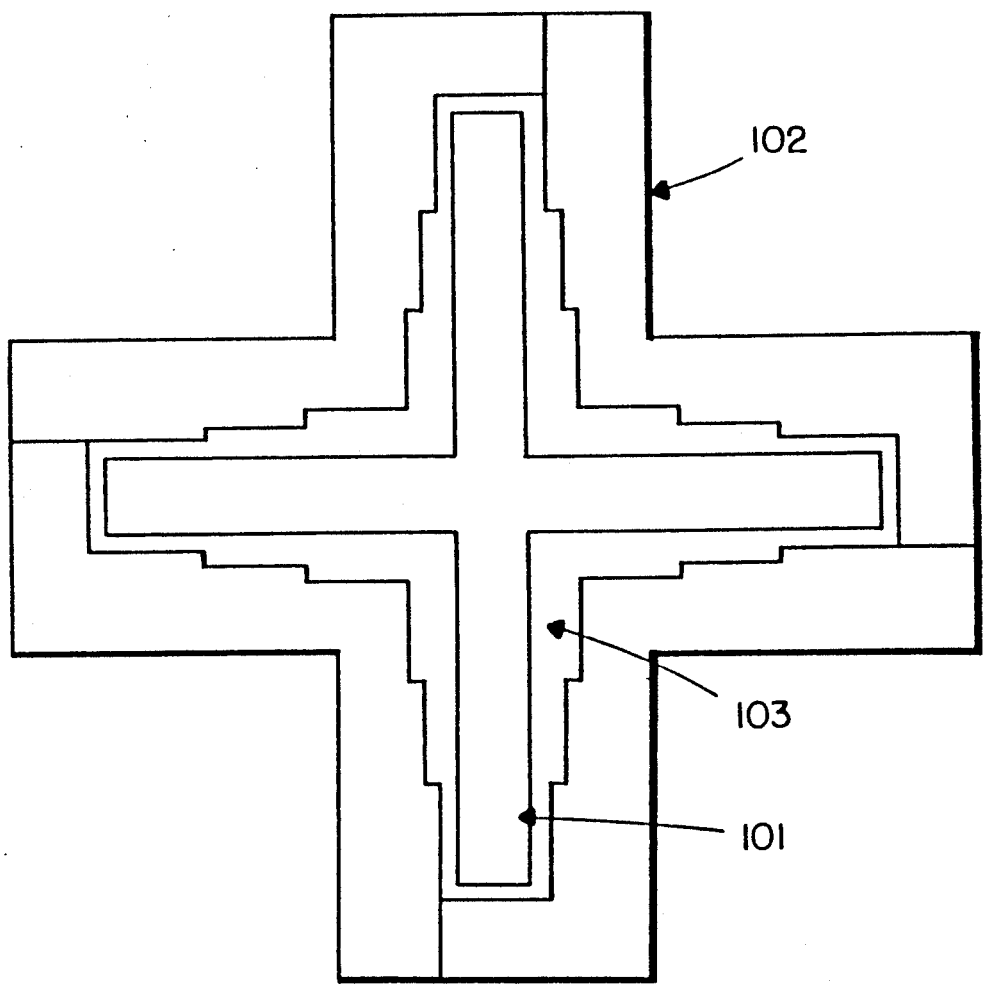
FIG. 1 depicts an example of how fiducial marks may be used to align objects using conventional lithography.

FIG. 1 depicts an example of how fiducial marks may be used to align objects using conventional lithography. These same types of marks may be used to realize the novel alignment techniques set forth herein.

In particular, FIG. 1 depicts a solid cross, 101, on a mask which may be aligned to a hollow cross, 102, on a wafer (FIG. 1). The crosses may be "nested" so that when they are in perfect alignment, symmetric gaps between the solid and hollow crosses (like gap 103) may be observed. Since small differences in such gaps are easily detected, the alignment may be carried out with high precision.

As will become clear hereinafter, the technique of aligning objects using fiducial marks may be carried out using a special type of alignment plate in combination with the pairs of objects to be aligned (such as lasers and fibers). The plate and the pairs of objects all are contemplated as having fiducial marks. The plate may be used first to perform alignment of the pairs of objects. Next, the plate can be used to aid in the subsequent positioning and fixing of the aligned objects onto amounting surface, with the alignment of the objects being maintained.

In accordance with one embodiment of the invention, the aforementioned lithographic alignment techniques are used to position small objects (parts) after first imprinting a set of fiducial marks on each part to be aligned. The marks should be imprinted in such a manner as to have a definite relationship to critical regions of the part. If the parts are fabricated by processes which themselves involve lithography, the production of appropriate fiducial marks may be carried out as a part of the fabrication process, sometimes with no extra fabrication steps.

Next, according to this same embodiment of the invention, the parts are aligned to each other by precisely aligning each part separately with respect to the above referenced special "alignment plate". The preferred alignment plate is transparent and may have many sets of lithographically made fiducial marks, corresponding to the several parts that need to be aligned. The alignment of each part to the alignment plate is accomplished by moving the part relative to the alignment plate until the corresponding fiducial marks are correctly juxtaposed. The motion may be observed through a transparent alignment plate with the aid of a microscope.

Nested alignment marks on the alignment plate and on each part may be used in the manner depicted in FIG. 1 for standard two object (e.g., mask and wafer) alignment. The fiducial marks on the alignment plate are pre-positioned so that when the parts are all separately aligned to the alignment plate, they are also correctly aligned to each other with high precision.

It is of course, necessary to fix the parts to the alignment plate. Usually only a temporary fixation is desired, since the parts are to be permanently held in relation to each other not be the alignment plate but by some other fixture, for example, a special substrate.

For temporary fixation electrostatic forces or a releasable cement might be used; however, according to the preferred embodiment of the invention, a more practical solution involves the use of a vacuum chuck.

To implement this concept, appropriate holes are contemplated as being drilled into the alignment plate, so that separate vacuum manifolds extend from each part to convenient pumping ports (e.g., located at the edge of the alignment plate). In operation, then, each part is separately moved into the correct position relative to the alignment plate as judged by the juxtaposition of the corresponding fiducial marks; upon attainment of the correct position, vacuum is applied to the manifold corresponding to that part, thereby fixing the part firmly to the alignment plate.

The process is repeated until all parts are temporarily fixed to the alignment plate. The parts are then ready for permanent fixation to the final substrate fixture in the manner to be described hereinafter.

According to one embodiment of the invention, this alignment procedure may be automated by using a pattern-recognition scheme to examine the fiducial marks, while feeding the information so gained into a precision controlled micro-motion system.

The invention may find general application in electron-device packaging, where components must be fastened to a fixture in precise relationship to each other. Application may also be found in optoelectronic component packaging where, as indicated hereinbefore, semiconductor lasers, for example, must be aligned to optical fibers with precision in the micrometer range.

Also, as indicated hereinbefore, the passive fiducial mark based alignment techniques described herein may be used instead of, or in combination with, commonly used active alignment schemes.

A specific optoelectronic component example of the novel alignment procedure is described hereinafter with reference to FIGS. 2-7. Here the principles of the passive fiducial mark alignment techniques are illustrated in the context of aligning a chip carrying four lasers to a carrier containing four corresponding optical fibers. It is assumed that the carrier (sometimes referred to herein as a "fiber carrier"), has been fabricated so that the fiber spacing is the same as that of the lasers, and that the vertical positions of the fibers are identical and correctly matched to the top of the lasers where the light is emitted. It should be noted that the fiber carrier may consist of "V" grooves etched in a silicon chip. Such etching can be carried out to high precision.

It is also assumed in the example depicted in FIGS. 2-7 that the laser is not bonded by the "C4" or "solder bump" method for "flip chip" mounting; but wire bonded with the junction side up. The fiducial mark alignment scheme can, however, also be employed with lasers having junction side down, i.e., using the C4 method for flip chip mounting, as will be described hereinafter with reference to FIG. 8.

Figure 2:
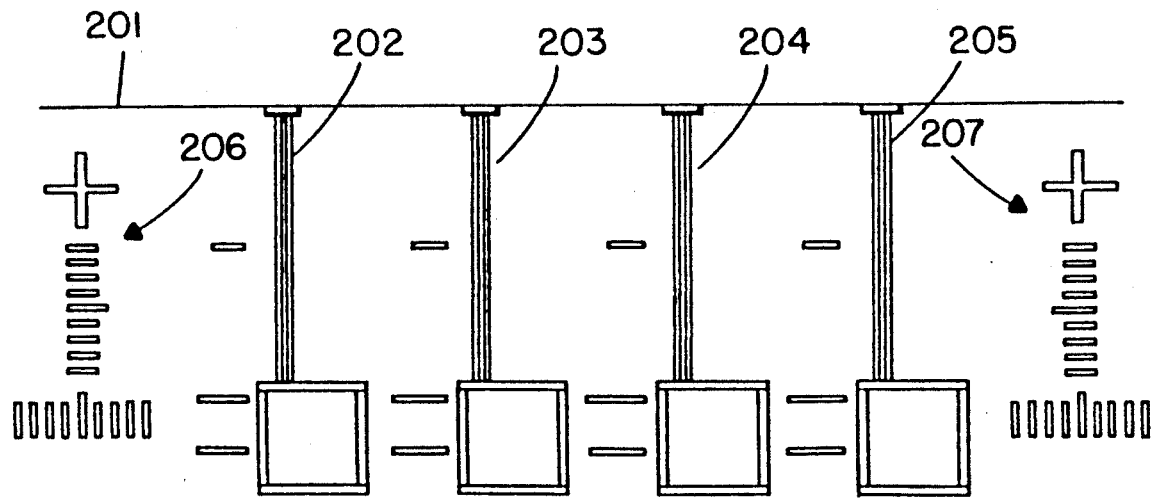
FIG. 2 depicts a laser chip containing four lasers and fiducial marks, where the fiducial marks may be used in carrying out the alignment of the lasers to optical fibers as contemplated by an illustrative embodiment of the invention.
Figure 3:
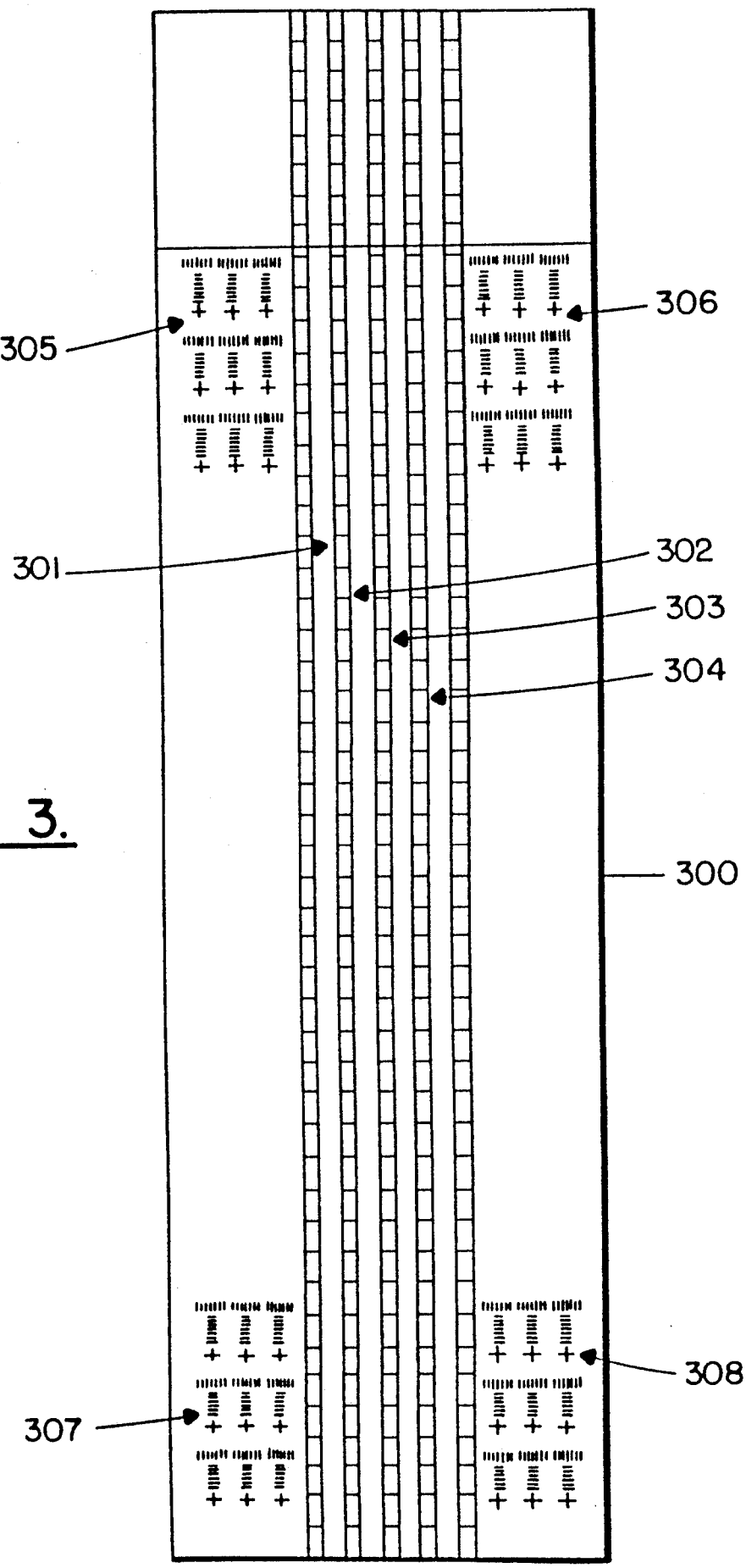
FIG. 3 depicts a carrier (referred to hereinafter as a "fiber carrier"), containing four optical fibers and fiducial marks, where the fiducial marks are suitable for use in carrying out the alignment of the lasers depicted in FIG. 2 to the optical fibers.

Reference should now be made to FIGS. 2 and 3 where a laser chip containing four lasers is illustrated (FIG. 2), while the mating fiber carrier is shown in FIG. 3 (the figures are not to the same scale). The fiducial marks on each of the parts should be noted.

In particular, FIG. 2 depicts chip 201 carrying four lasers, 202-205. The chip also has fiducial marks located at 206 and 207. FIG. 3 depicts four fiber channels (e.g., grooves for positioning fibers), 301-304, in fiber carrier 300. Fiducial marks also appear on the fiber carrier 300 (four sets of marks are shown at 305-308).

Figure 4:
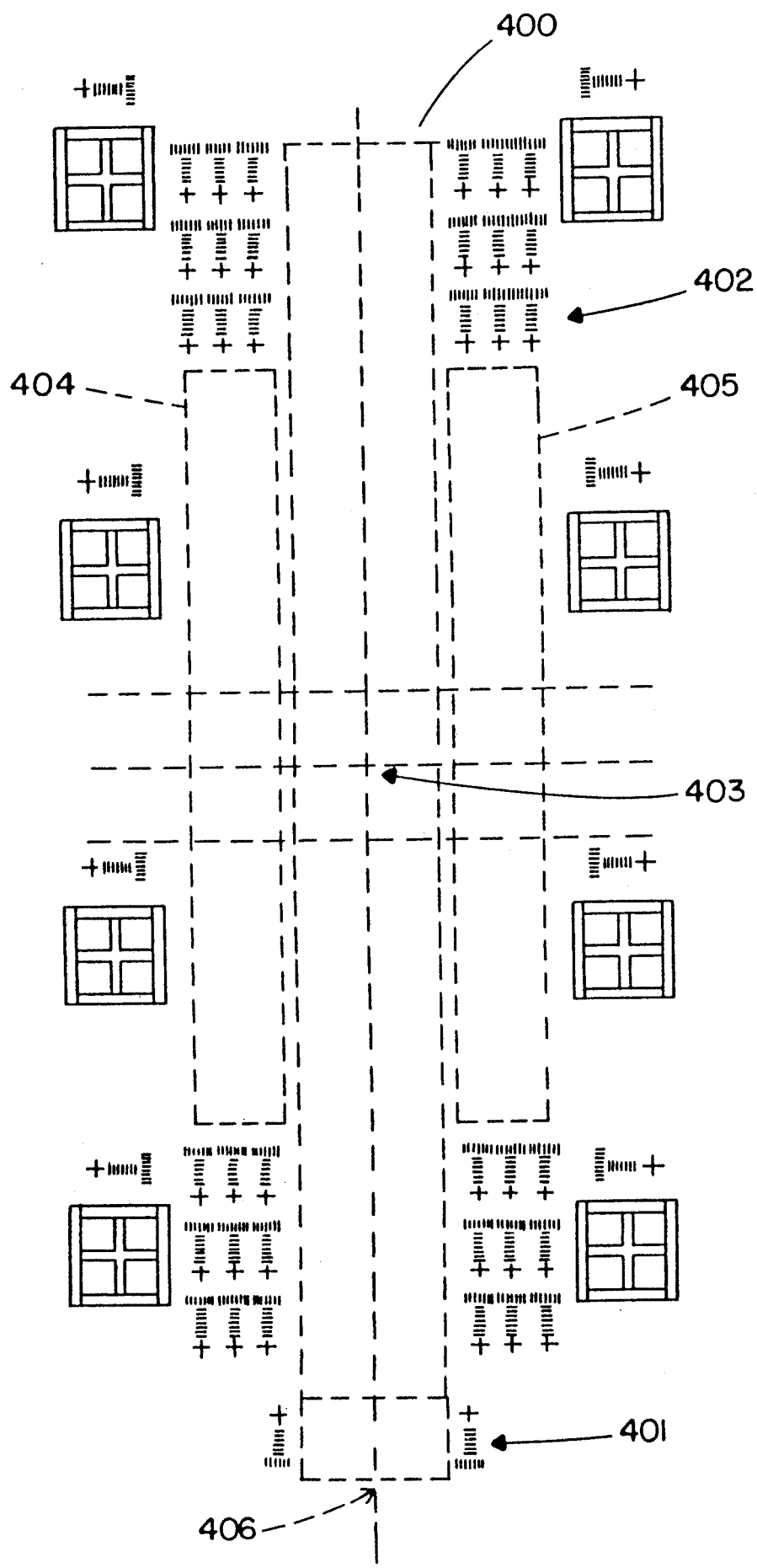
FIG. 4 depicts a top view of an exemplary glass alignment plate which may be used in conjunction with the devices depicted in FIGS. 2 and 3 to perform the alignment contemplated by the invention. In particular, fiducial marks corresponding to those shown in FIGS. 2 and 3 are shown on the plate depicted in FIG. 4.

Reference should also now be made to FIG. 4 which depicts a top view of an exemplary alignment plate, 400, that may be used in conjunction with the devices depicted in FIGS. 2 and 3 to perform the alignment contemplated by the invention. In particular, fiducial marks corresponding to those shown in FIGS. 2 and 3 are shown on plate 400 of FIG. 4. The fiducial marks located at 401 on plate 400 are an example of marks that correspond to the marks located at position 206 (or 207) on laser chip 201 of FIG. 2.

The fiducial marks located at 402 on plate 400 are an example of marks that correspond to the type of marks located at 305-308 on carrier 300 of FIG. 3.

It should be noted that there are several sets of fiducial marks on plate 400 (at, for example, location 402) corresponding to the marks on carrier 300. These sets of marks may be used to select from a number of predefined possible spacings between the laser and the fiber carrier.

A recess (shown at 403 in FIG. 4) is built into alignment plate 400 so that the fibers do not prevent the surface of the silicon carrier of fiber carrier 300 from contacting alignment plate 400 in the fiducial mark area. Rectangular apertures 404-406 may be noted in the regions adjacent to the fiducial marks in both the laser and fiber carrier positions. According to one embodiment of the invention, suction is provided through these apertures to fix these parts to the fiber carrier after correct positioning has been attained.

A side view of the alignment plate, laser and fiber carrier is shown schematically in FIG. 5 (not to the scale of FIGS. 2-4). In particular, FIG. 5 depicts paths for providing suction through glass alignment plate 500. These paths are shown at 501 and 502 of FIG. 5. Each path is further shown as being coupled to a vacuum source, like source 504, via vacuum couples 503 and 505.

Also depicted in FIG. 5 is a fiber (510) positioned in a groove in fiber carrier 511. The laser to be aligned with fiber 510. is shown in FIG. 5 as laser 512. Fiducial marks corresponding to the marks depicted in FIGS. 2 and 4 (for laser 201 and alignment plate 400 respectively), are shown at 515 and 516 of FIG. 5. Fiducial marks corresponding to the marks depicted in FIGS. 3 and 4 (for the fiber carrier 300 and alignment plate 400 respectively), are shown at 517 and 518 of FIG. 5.

Those skilled in the art will appreciate that the fabrication of the alignment plate must be carried out with care. One suitable technique is to use a chromium film covered mask blank which is standard in every respect except that it is thicker than usual, being approximately 3 millimeters thick. Both the fiducial marks discussed above and additional guide marks for subsequent glass machining processes, can be delineated in the chromium film by standard lithographic processes. The vacuum manifolds may then be fabricated with special glass cutting equipment. The round holes whose axes are in the plane of the alignment plate are drilled with rotating glass cutting drills, while the mating rectangular holes (as depicted in FIG. 4), can be made with ultrasonic cutting.

Figure 6:
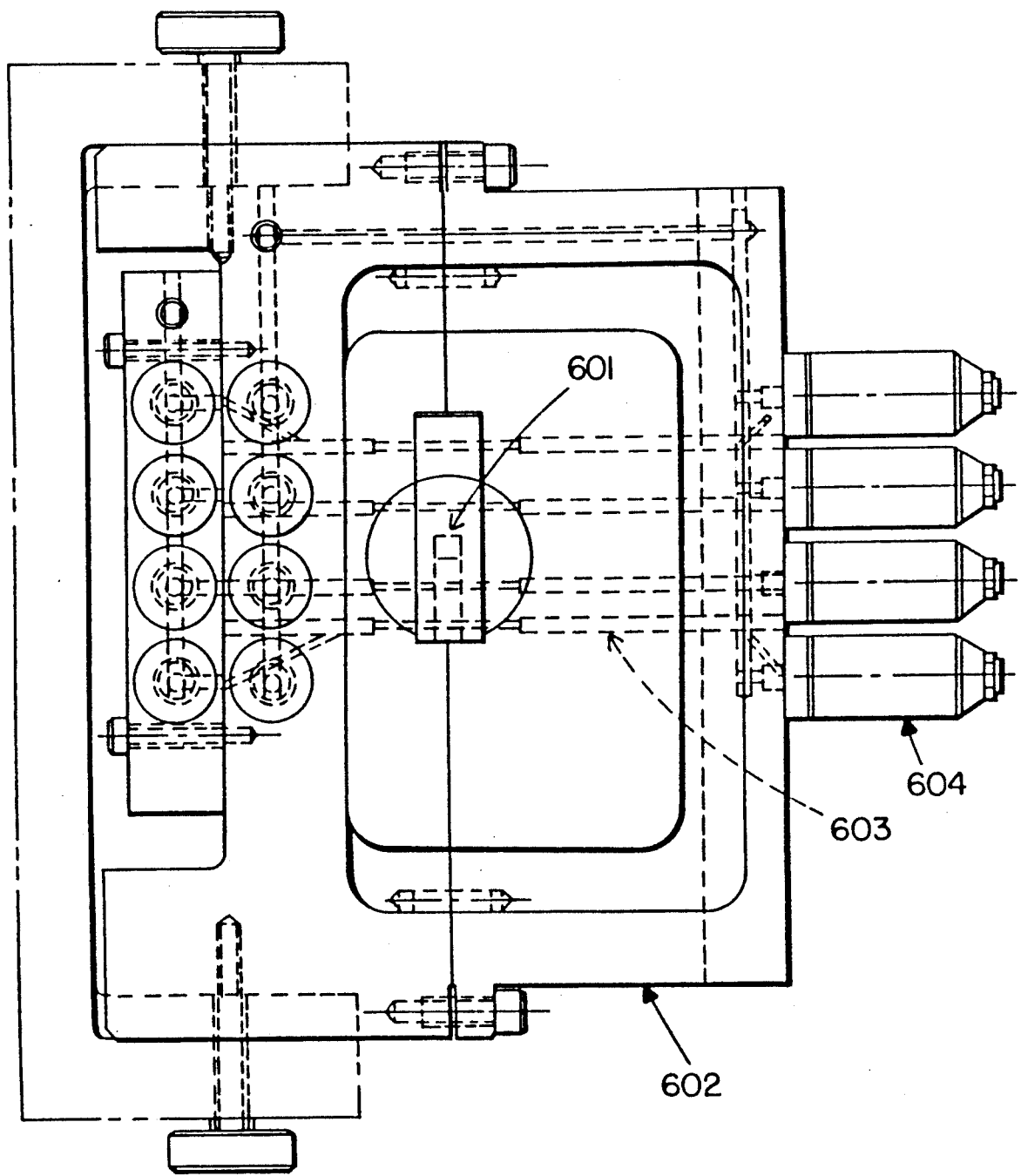
FIG. 6 illustrates one embodiment of the ancillary equipment used with the glass alignment plate, suitable for use in accordance with the teachings of the invention; the alignment plate is held in a frame and combined with vacuum plumbing to facilitate temporarily holding objects in place against the alignment plate.

FIG. 6 illustrates one embodiment of the apparatus for holding and applying vacuum to a glass alignment plate, suitable for use in accordance with the teachings of the invention; the alignment plate is held in a holder which contains vacuum plumbing which is controlled by electrically accessed solenoid valves to facilitate temporarily holding objects in place against the alignment plate.

A glass alignment plate, shown at 601 of FIG. 6, is depicted in FIG. 6 as being held in a frame (602) which also contains vacuum plumbing (e.g., plumbing 603).

Solenoid valves (like the one shown at 604) are provided so that the appropriate vacuum ports can be opened and closed electrically, and so that positive air pressure can be selectively provided to release the vacuum where desired.

According to one embodiment of the invention, frame 602 is held in a special jig, underneath a standard microscope, in a manner which permits translation of the frame (and hence alignment plate) in the horizontal plane. This is depicted in FIG. 7 which illustrates a sample alignment station as contemplated by the invention.

Figure 7:
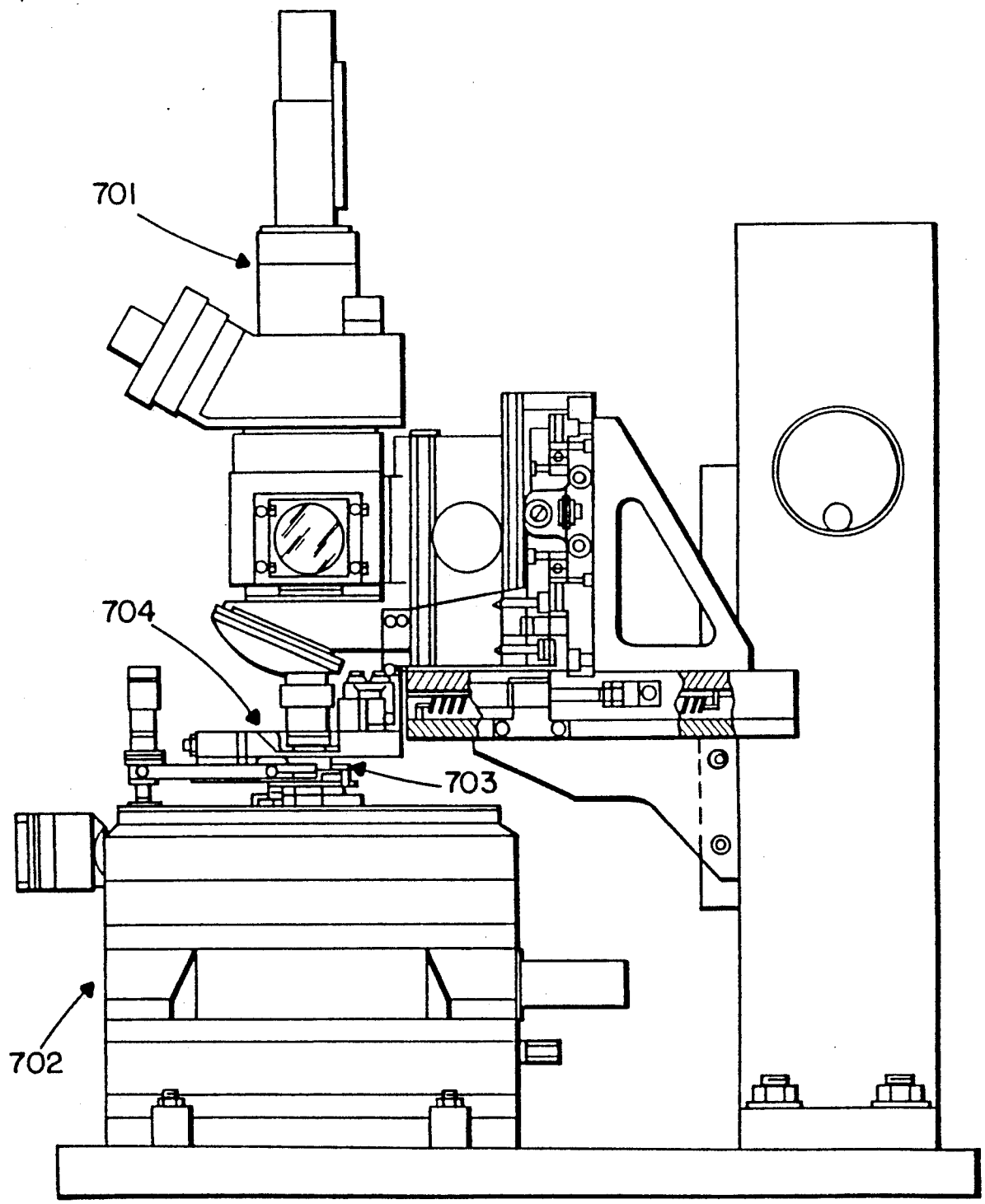
FIG. 7 illustrates a sample alignment station which encompasses all the equipment for fabrication of a laser-fiber module, as contemplated by the invention.

In the station depicted in FIG. 7, the bottom plane of the alignment plate, the top of the laser and fiber carrier, can be viewed with microscope 701. Special objectives, which are corrected for viewing through thick glass, can be used with the microscope. A stage (702) is provided below the alignment plate which, according to one embodiment of the invention, carries the laser and fiber carrier in special "nests". Stage 702 provides the necessary horizontal motion to permit alignment of the corresponding fiducial marks, and vertical motion so that after alignment the laser and fiber carrier can be sequentially brought up to the alignment plate and the appropriate vacuum manifolds activated. The parts to be aligned are depicted in FIG. 7 at 703, while the alignment frame (holding the alignment plate and vacuum plumbing) is depicted at 704 of FIG. 7.

Alignment in the vertical direction can be accomplished through the agency of the very flat bottom surface of the alignment plate which bears against the upper surfaces of both the laser and the fiber carrier. In applications which employ a ridge laser, which has the property of emitting essentially at its top surface, the fiber carrier would be made so that the depth of the aforementioned "V" grooves is such that the axis of each fiber is coplanar with the top surface of the fiber carrier. This can be accomplished by controlled precision anisotropic etching of the "V" grooves in silicon, a well known technique. It is therefore necessary only to make the top surfaces of the laser and the fiber carrier coplanar, which can be accomplished by contacting (e.g., by vacuum anchoring) both objects with the very flat surface of the alignment plate.

Bottom Surface Reference

In the illustrative embodiment of the invention described hereinabove with reference to FIGS. 2-7, the parts to be aligned have critical regions and fiducial marks on their top surface. As a result, it is relatively simple to align the parts to the bottom surface of the alignment plate. There may be cases, however, when some parts have critical regions and alignment marks on the bottom, such as flip-chip mounted lasers. The fiducial mark alignment scheme contemplated by the invention can still be carried out in this case by (for example) producing matching sets of fiducial marks on the top as well as bottom surfaces of the part, or by using light of an appropriate wavelength for which the part is transparent. Thus, for the sake of illustration, for a GaAs laser, long wavelength infrared microscopy could be used.

Although such a scheme would work, a more practical scheme, contemplated by yet another embodiment of the invention, may be seen, and will be described hereinafter, with reference to FIGS. 8A and 8B.

Figure 8A:
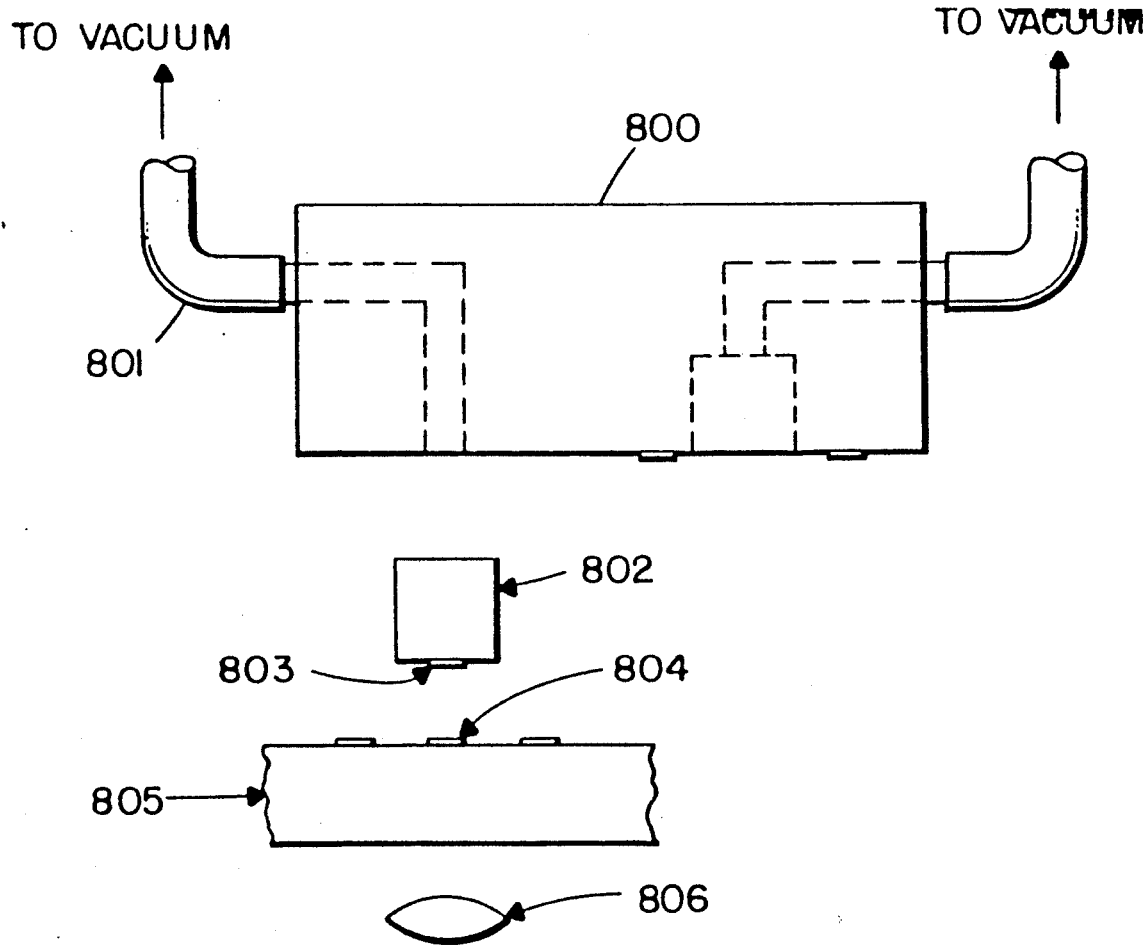
FIGS. 8A and 8B depict a two step alignment scheme suitable for use in aligning objects having critical regions and alignment marks on the bottom of the objects, such as flip-chip mounted lasers.
Figure 8B:
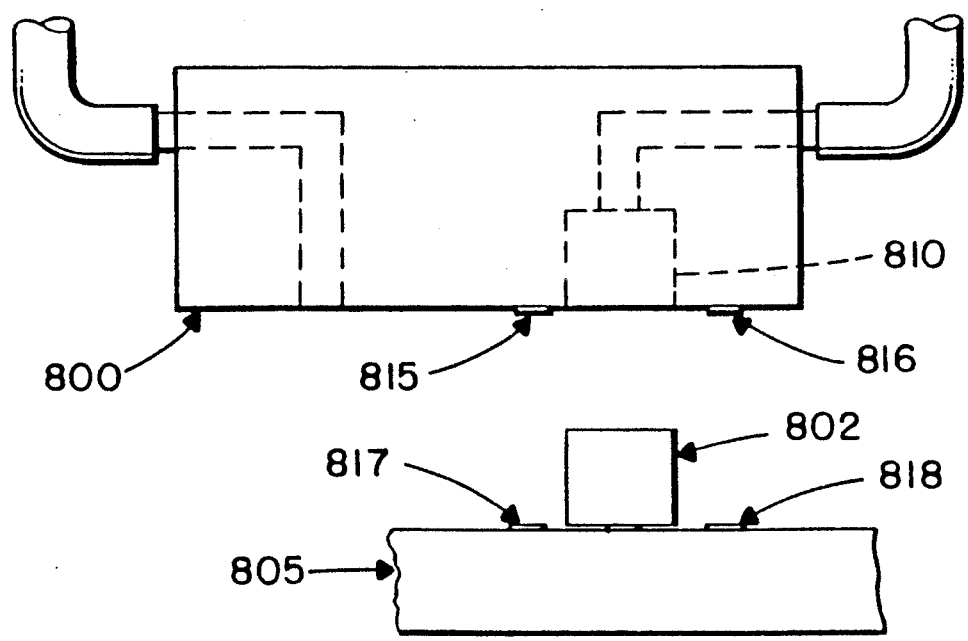

FIGS. 8A and 8B depict a two step alignment scheme suitable for use in aligning objects having critical regions and alignment marks on the bottom of the objects, such as flip-chip mounted lasers. In the first step (FIG. 8A), the alignment plate, 800, is lowered; vacuum is applied to the left hand manifold, 801; and the part (802) is picked up and positioned so that its fiducial mark (803) is aligned to the center fiducial mark (804) on transparent base 805. The aligning operation may be observed by a microscope positioned below the transparent base as illustrated at 806. The vacuum may be released at the conclusion of this first step, i.e., when the part is aligned with respect to the transparent base.

In the second step (FIG. 8B) the alignment plate is laterally shifted, then lowered so that the recess (810) in plate 800 is directly over part 802. The fiducial marks on the bottom of the alignment plate (815 and 816) are then laterally positioned so they are aligned to the outer fiducial marks (817 and 818) on transparent base 805. In this step the microscope is positioned above the alignment plate. After completion of this operation, vacuum is applied so the part is fixed to the alignment plate as usual.

Fixing to Substrate

Having described methods and apparatus for passively aligning pairs of objects prior to fixing them to a mounting surface, a method for precisely fixing the aligned parts will now be described with references to FIGS. 9 and 10.

FIG. 9 illustrates the principles of fixation by soldering, suitable for use in accordance with the teachings of the invention, to fix precisely aligned objects on a mounting surface, independent of how the objects are aligned.

Figure 10:
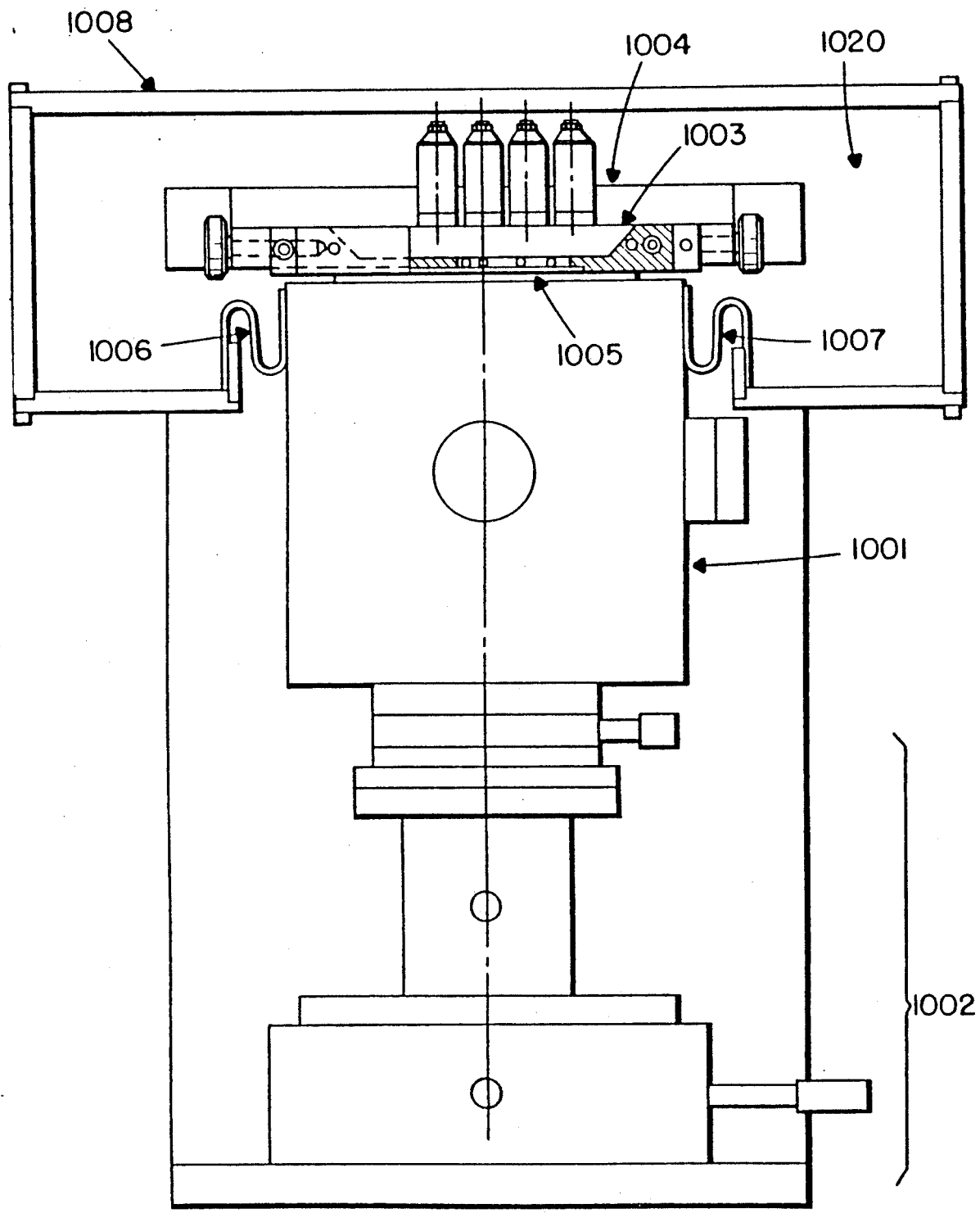
FIG. 10 illustrates a soldering station, i.e., a heating chamber arrangement placed over a stage permitting motion in both horizontal and vertical directions, to facilitate carrying out soldering applications contemplated by the invention quickly so as to minimize the amount of time heat sensitive objects (such as lasers) are exposed to high temperatures.

FIG. 10 illustrates a soldering station, i.e., a heating chamber arrangement placed over a stage permitting motion in both horizontal and vertical directions. The arrangement depicted in FIG. 10 facilitates carrying out soldering applications contemplated by the invention quickly so as to minimize the amount of time heat sensitive objects (such as lasers) are exposed to high temperatures.

As indicated hereinabove, customary fixation methods for permanently fixing small aligned parts (independent of the manner in which the parts are aligned) involve either cementing, e.g., by use of epoxy, or soldering. The novel technique contemplated by the invention, to be described immediately hereinafter, is designed to minimize the problems that can arise if the parts move during the setting of the cement, or the freezing of the solder.

According to this aspect of the invention, the parts to be fixed are first temporarily attached (e.g., by vacuum to the alignment plate) to another fixture. The fixture is then positioned over the substrate to which permanent attachment is desired. Cement or solder is then applied to appropriate parts of the substrate. Next, the fixture is aligned to the substrate (e.g., by using microscopy). Finally, the fixture is lowered so that the parts contact patches of semi-liquid cement or molten solder on the substrate. Since the cement or solder is deformable, small differences in the heights of the parts can be tolerated and compensated for.

After the cement has a chance to set (or the solder is allowed to freeze) the fixture can then be removed.

Since the parts are rigidly held during the setting or freezing process they should remain substantially in their prealigned positions. The cement or solder is preferably designed to be pliable enough to accommodate any strain produced during the setting or freezing process.

The above disclosed procedures may be illustrated in context of the optoelectronic application discussed with reference to FIGS. 2-7. For such application, soldering is the preferred bonding method.

As shown in FIG. 9, alignment plate 900, with the vacuum attached laser 901 and fiber carrier 902, is lowered so that laser 901 and fiber carrier 902 penetrate the molten pools of solder (903-905) which have been provided on ceramic substrate 906. The lateral adjustment of the alignment plate is carried out while viewing corresponding fiducial marks on the alignment plate and the substrate with the aid of a microscope positioned above the alignment plate. Appropriate metallization is of course previously applied to the surface of the substrate 906 and to the bottoms of laser 901 and fiber carrier 902, to permit wetting of the solder. Upon cooling of the solder, the vacuum (shown provided via paths 910 and 911), may be broken and the alignment plate can then be removed.

For the above described optoelectronic application, it is important to carry out the soldering application quickly so as to subject the laser to high temperatures for as short a time as possible. A scheme for accomplishing this, as indicated hereinabove, is illustrated in FIG. 10.

FIG. 10 shows a heating chamber, 1001, placed above a stage, 1002, permitting motion in horizontal as well as vertical directions. The alignment plate, 1003, is positioned in its frame, 1004, over substrate 1005, which rests on top of heating chamber 1001. Substrate 1005 and alignment plate 1003 are preferably located in a gas chamber (1020) in which forming gas has displaced the air so as to permit soldering with minimum flux. Rubber seals 1006 and 1007 are shown to provide a seal for the forming gas chamber. The remainder of chamber 1020 may otherwise be fabricated out of glass, as indicated by one of its glass walls which is shown as chamber wall 1008 in FIG. 10. Heat flows to the substrate by two methods: Joule heating from a pancake heating coil is applied so as to provide a temperature "bias" which is below the melting point of the solder. The final increment in temperature needed to melt the solder is given by an optical system which focuses light on the back side of the substrate at the solder positions.

It should be understood that the invention is not intended to be in any way limited by the fixing technique described with reference to FIG. 10. The apparatus and methodology described is simply an example of how to carry out the fixing process described hereinabove.

Incorporation of Active Alignment

Having described how to passively align a pair of objects and then fix the objects to a mounting surface while maintaining their relative alignment, reference should be made to FIGS. 11 and 12 (and the following description) to understand how, according to yet another embodiment of the invention, a combination of passive and active alignment techniques can be used to align (and subsequently fix) pairs of small objects.

Figure 11:
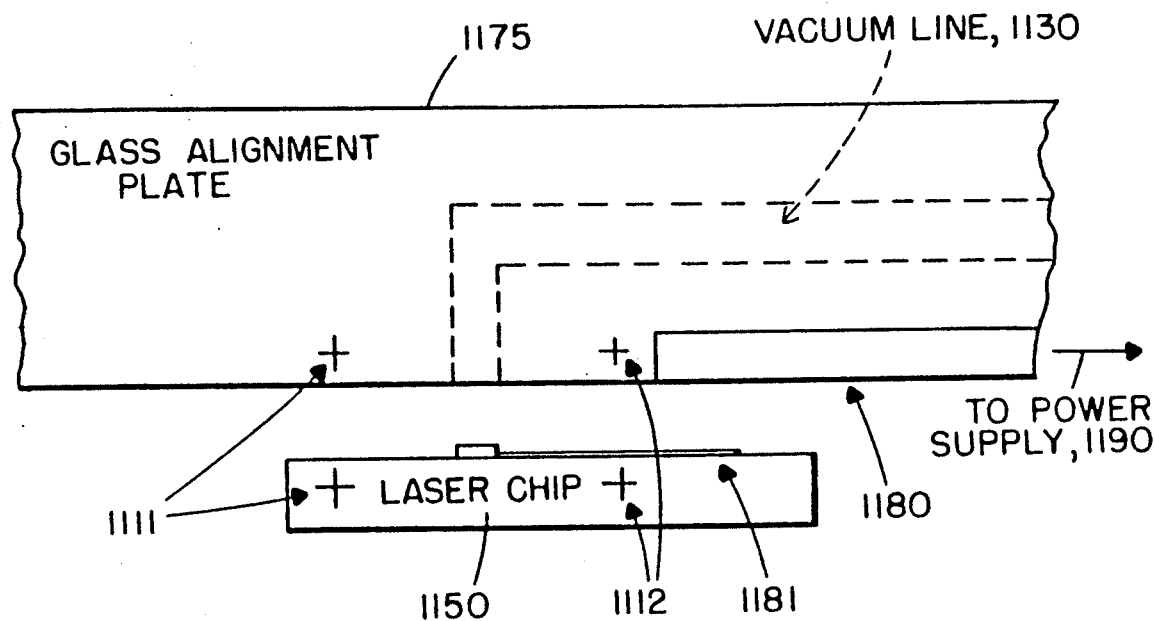
FIG. 11 illustrates a means for providing electrical contact to a laser from an alignment plate, to facilitate aligning the laser to a fiber using a combination of passive and active alignment techniques.

FIG. 11 illustrates a means for providing electrical contact to a laser from an alignment plate, to facilitate aligning the laser to a fiber using a combination of passive and active alignment techniques.

Figure 12:
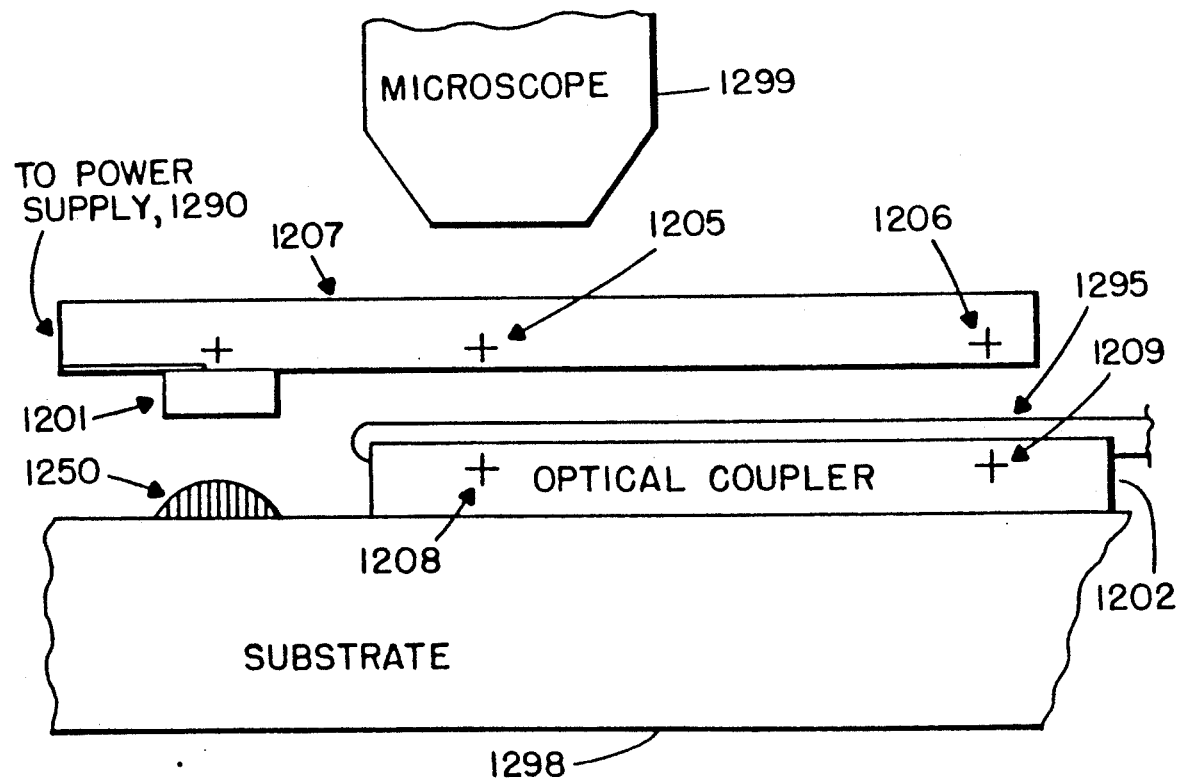
FIG. 12 illustrates techniques for placement of a laser into molten solder using the passive/active alignment techniques contemplated by the invention.

FIG. 12 illustrates techniques for placement of a laser into molten solder using the passive/active alignment techniques contemplated by the invention.

Although the above described methods for achieving alignment of a fiber (or a waveguide) to a laser by passive means can be used to perform alignment to within about 1 micrometer (which should be adequate for alignment of multimode fibers); the alignment of a laser to single mode fibers may require alignment tolerance of less than 1 micrometer. For such accuracy, some form of active alignment will probably be necessary.

According to the invention, the previously discussed passive alignment scheme can be used to obtain a "coarse" alignment of the laser to the fiber. Active alignment can then be used for the remaining final small (submicrometer) adjustment for maximum signal. The specific scheme to be described hereinafter permits this passive/active alignment for an unmounted laser chip. This scheme offers the additional advantage of "in-situ" testing whereby poorly performing lasers can be rejected and replaced while retaining the fiber carrier.

According to the previously described passive alignment method, the laser and fiber carrier are both vacuum attached to the glass alignment plate in precisely determined positions, and are then both simultaneously soldered to the substrate. In the present passive-active embodiment of the invention, however, the fiber carrier would be separately soldered to the substrate. The laser chip could then be vacuum attached to the glass alignment plate as usual by superimposing corresponding fiducial marks. This is illustrated in FIG. 11 with the fiducial marks 1111 and 1112 (on plate 1120 and laser 1125) being superimposed before vacuum attaching (via vacuum line 1130) laser chip 1150 and plate 1175.

Furthermore, according to the instant embodiment of the invention, both alignment plate 1175 and laser chip 1150 would be furnished with electrical pads 1180 and 1181, respectively. Pad 1180 would contact pad 1181 on the laser chip. An electric potential suitable for turning on the laser can then be applied through this electrical connection. (Pad 1180 is shown connected to a power supply as indicated by arrow 1190). Since no ground contact has been furnished, the laser is not activated.

The first step in the alignment procedure consists of heating the substrate to melt the solder in the position corresponding to the laser. It is recommended that a higher melting temperature solder be used for the fiber carrier than the laser to avoid movement of the fiber carrier during placement of the laser.

Next, with reference to FIG. 12, the vacuum attached laser, 1201, may be aligned to fiber carrier 1202 by matching (with the aid of microscope 1299) the fiducial marks (1205 and 1206) on alignment plate 1207, to those on the fiber carrier (1208 and 1209). If this passive alignment gave perfect alignment no further operations would then be needed. However, as discussed above, it is assumed that a final adjustment of something on the order of 1 micrometer is required for single mode applications, and this final adjustment may be achieved by a quick active alignment following the passive alignment operation.

According to an illustrative embodiment of the invention, a proposed implementation for the active alignment step starts just as the passive alignment is being completed. This is because laser 1201 turns on when the negative side of laser 1201 contacts the molten solder shown at 1250 in FIG. 12. As in FIG. 11, a power supply is shown coupled to laser 1250, via pad 1290 on plate 1207.

Using standard robotic means, laser 1201 can then be moved very rapidly (in a second or so) to the position corresponding to maximum light output.

While tilt, upward, and lateral motions of laser 1201 are possible during the active alignment step, the downward motion is prevented when glass alignment plate 1207 hits the surface of fiber carrier 1202. To permit sufficient range of motion in the downward direction, to enable positioning for optimum alignment, fiber carrier 1202 may be designed so that the centers of the optical fibers, like fiber 1295, (or waveguides), are about 1 micrometer above its surface.

Quick final alignment is obtained because the previous passive alignment should be close enough to ensure an output signal from fiber 1295, thereby obviating the need for any complex search routines, and because the movements required are only a micrometer or so. The quick alignment also minimizes the suppression of the laser output caused by a rise in its temperature originating in the soldering operation.

If an inadequate output signal was found during the active alignment procedure, or immediately after that procedure following solidification of the solder, laser 1201 could be removed, discarded, and another laser could be picked and placed using the same procedure. No time consuming desolder rework procedure would thus be necessary and an "in-situ" package testing of the laser is possible.

It should be noted that in the preceding description it is assumed that fiber carrier 1202 and substrate 1298 are two distinct parts which must be soldered together to make a complete module. A preferred embodiment of the invention contemplates having a single part which would combine the functions of fiber carrier 1202 and substrate 1298 (in one piece), thereby achieving simplicity and lower cost. The passive/active alignment scheme would proceed as described above, but would involve only the laser and the combined fiber carrier/substrate.

Batch Processing of Modules

Finally, the invention encompasses the incorporation of alignment techniques taught herein into a batch manufacturing process. The details of such a process are described hereinafter with references to FIGS. 13-15, where FIG. 13 illustrates, in accordance with the teachings of the invention, the basic principle of batch fabrication of modules of aligned pairs of objects, and more particularly, the batch fabrication of laser-fiber modules; FIG. 14 illustrates the combination of a substrate and fiber carrier with sawed slots, i.e., the "comb" type of structure contemplated by one embodiment of the invention; and FIG. 15 depicts the position of the final saw cutouts, after soldering a laser bar, using the techniques described herein to fabricate laser-fiber modules in a batch process.

Like the examples used to describe the novel alignment techniques set forth hereinbefore, the batch fabrication process will be described in the context of fabricating laser-fiber modules. Those skilled in the art will appreciate that the same principles as set forth hereinafter may be applied to batch processing operations involving other types of objects, so long as it is desired to align a plurality of pairs of objects and mount the aligned pairs on a mounting surface.

According to this embodiment of the invention, many laser-fiber modules are made simultaneously, and are subsequently separated.

The first step in the novel batch method is to align an array of lasers to an array of fibers using the above described passive alignment techniques. The laser array may be realized by making a laser "bar" which contains a multiplicity of individual lasers along with the appropriate fiducial marks necessary for passive alignment. Such laser bars are made in conventional laser processing wherein the bars are diced out of the wafer and individual lasers are diced out of each bar. The fiber array may be realized by making a fiber carrier which contains an array of fibers, e.g., in an array of V-shaped grooves etched into a silicon block. Fiducial marks needed for passive alignment are also provided on the fiber carrier. The laser array is then aligned to the fiber array by the passive alignment method so that each individual laser is precisely aligned to its corresponding fiber.

After this step the individual laser-fiber pairs can be cut apart, as illustrated in FIG. 13 where (for example), individual laser-fiber module 1303 results from cutting along dotted lines 1301 and 1302. The lasers depicted in FIG. 13 are labeled 1350-1355, the fibers are labeled 1360-1365, and hence the module resulting from the aforementioned cut would contain laser 1355 paired with fiber 1365.

It is this cutting operation that is novel. Semiconductor lasers are extremely delicate and must be handled with great care to prevent impact on performance and lifetime. For this reason a crude dicing operation (such as sawing) for separating the individual modules would be unacceptable. Using such dicing operations would subject the lasers to excessive strain. The laser facets would also likely be covered with debris. What is required is a dicing operation which is successful in delineating the modules yet separates the individual lasers in the laser-bar by a conventional operation (e.g., cleaving) which does minimal damage to the laser.

A method of accomplishing this procedure is comprised of the following steps:

1. The (array) fiber carrier is first fully fabricated, including the positioning and bonding of appropriately lensed fibers.

2. The fiber carrier is then bonded to the substrate.

3. A precision, preferably automated, dicing saw may then be used to saw an array of slots into the substrate and overlying fiber carrier. This step yields a comblike structure in which a given slot is positioned between two fibers as illustrated in FIG. 14. FIG. 14 depicts substrate 1401, with fiber carrier 1402 mounted thereon (alternatively substrate 1401 and fiber carrier 1402 can be thought of as a unitary component), and with optical fibers (such as 1403 and 1404) being spaced apart and separated by the aforementioned saw cut slots (e.g., 1405 and 1406). It should be noted that the slots do not extend to the laser end of substrate 1401, so that the substrate is still an intact unit. It is also possible, according to an alternate embodiment of the invention, to position the fiber carrier away from the edge of the substrate and saw the slots so that both ends of the substrate are unslotted, thereby giving the resulting structure more mechanical strength. Care would then have to be taken in subsequently removing the unslotted end associated with the fibers so as not to damage them.

4. A laser bar may now be aligned with respect to the fiber carrier, e.g., by using fiducial marks in accordance with the teachings described hereinbefore, and then the laser bar may be bonded to the substrate, as shown in FIG. 15, where laser bar 1550 appears along with the components bearing the same reference numerals as in FIG. 14. Laser bar 1550 is positioned so as to straddle the previously made slots (like slots 1405 and 1406, etc.). It should be noted that in the alignment procedures previously described herein, the laser and the fiber carrier were each aligned with respect to fiducial marks on a separate alignment plate, then simultaneously bonded to the substrate. According to the preferred embodiment of the batch processing method being described herein, the laser bar is separately aligned and bonded to a fiber carrier which had previously been aligned and bonded to the substrate. This variation is appropriate to the batch fabrication method and is particularly amenable to automation.

5. Wire bonding to the individual lasers and corresponding pads may now be carried out.

6. The intact end (or ends) of the substrate is then sawed off so that the individual modules are held together only by laser bar 1550 itself. This is illustrated by final saw cut 1575 shown in FIG. 15. It should be noted that if the substrate is made of silicon, the unslotted portions can be removed by making a scribe mark early in the fabrication sequence, then cleaving can be performed when needed.

7. The individual modules can now be separated by multiple cleaves of laser bar 1550, since it is only the laser bar which now holds the assemblage together. Each cleave is made at a slot position, where laser bar 1550 is unsupported by substrate 1401. Such cleaves can be carried out, for example, by placing the ensemble depicted in FIG. 15 on a rigid surface, then striking laser bar 1550 smartly in appropriate places with a thin, sharp edge.

8. The individual modules are then ready for hermetic sealing, and bonding to the next level of packaging.

Furthermore, according to the invention, several variations in this procedure are possible. It may be advisable to place a "pedestal" between the laser and the substrate in order to permit better thermal match between the laser and its immediate supporting member and to ensure proper height matching between the two components. The batch processing method could also be used with "flip-chip" of the laser, i.e., with the emitting side of the laser adjacent to (instead of away from) the substrate. Also, an array of photodiodes, either integrated into the laser chip or separate from it, could be included in the package using the same method, and driver chips could similarly be included, i.e., by die bonding a multicomponent chip so as to straddle the slots, then cleaving into chiplets. Further, it may be possible to hermetically seal the entire array, then dice it into individual modules.

Although the description of batch manufacturing techniques has been confined to laser modules, the invention also contemplates similar batch production techniques being applied when making transmitter modules containing edge emitting LEDs instead of lasers. Furthermore, the techniques described herein could also be used for fabrication of receiver modules, e.g. modules consisting of a fiber carrier carrying fibers, but a "receiver bar", i.e., a chip containing an array of receivers, instead of a laser bar.

What has been described are methods, apparatus and manufacturing techniques which meet all of the objectives set forth hereinbefore. Those skilled in the art will recognize that the foregoing description has been presented for the purposes of illustration and description only. It is not intended to be exhaustive or to limit the invention to the precise form disclosed, and obviously many modifications and variations are possible in light of the above teaching.

The embodiments and examples set forth herein were presented in order to best explain the principles of the instant invention and its practical application to thereby enable others skilled in the art to best utilize the instant invention in various embodiments and with various modifications as are suited to the particular use contemplated.

What is claimed is:

1. Apparatus for passively aligning pairs of objects using fiducial mark based alignment techniques, comprising:
   (a) a transparent alignment plate having a plurality of fiducial marks imprinted thereon;
   (b) at least one pair of objects, each having a fiducial mark imprint corresponding to one of said plurality of fiducial marks located on said transparent alignment plate; and
   (c) means for optically aligning the fiducial mark located on each object of said at least one pair of objects with the corresponding fiducial marks on said transparent alignment plate, thereby yielding at least one pair of passively aligned objects.

2. Apparatus as set forth in claim 1 further comprising:
   (a) means for temporarily fixing the position, relative to said alignment plate, of said at least one pair of passively aligned objects, prior to permanently fixing said objects onto a mounting surface;
   (b) means for positioning the medium onto which said at least one pair of passively aligned objects is temporarily fixed, into alignment with predefined mounting locations on said mounting surface; and
   (c) means for permanently fixing said at least one pair of passively aligned objects onto said mounting surface.

3. Apparatus as set forth in claim 2 wherein said means for positioning utilizes fiducial mark based alignment techniques to optically align said medium and said mounting surface.

4. Apparatus as set forth in claim 3 wherein said transparent alignment plate serves as said medium onto which said at least one pair of passively aligned objects is temporarily fixed.

5. Apparatus as set forth in claim 3 wherein at least one of said aligned objects is held in place against said medium within grooves or depressions in said medium.

6. Apparatus as set forth in claim 4 wherein at least one of said aligned objects is held in place against said medium by vacuum suction.

7. Apparatus as set forth in claim 4 further comprising the combination of a frame, within which to hold and facilitate positioning of said transparent alignment plate, and vacuum plumbing, for creating a vacuum with which to temporarily fix said at least one pair of passively aligned objects to said alignment plate.

8. Apparatus as set forth in claim 1 wherein said pair of objects further comprise optoelectronic components.

9. Apparatus as set forth in claim 8 wherein said optoelectronic components further comprise a laser and an optical fiber.

10. Apparatus as set forth in claim 1 wherein said transparent alignment plate is utilized to align said objects in the vertical direction.

11. Apparatus for passively aligning pairs of objects using fiducial mark based alignment techniques, wherein at least one of said objects is to be mounted onto a mounting surface in a flip-chip configuration, comprising:
 (a) a transparent alignment plate having a plurality of fiducial marks imprinted thereon;
 (b) a transparent base, having a plurality of fiducial marks imprinted thereon;
 (c) at least one pair of objects, wherein at least one object is to be mounted onto said mounting surface in a flip-chip configuration and has a fiducial mark imprint corresponding to one of said plurality of fiducial marks located on said transparent base; and
 (d) means for aligning the fiducial mark imprinted on said at least one object with its corresponding fiducial mark on said transparent base, and positioning the aligned object thereon.

12. Apparatus as set forth in claim 11 further comprising:
 (a) plate/base alignment means, for aligning at least one of said plurality of fiducial marks imprinted on said transparent alignment plate with at least one of said plurality of fiducial marks imprinted on said transparent base; and
 (b) means for temporarily fixing the position, relative to said alignment plate, of said object positioned on said transparent base, to thereby facilitate mounting said object on said mounting surface in said flip-chip configuration.

13. Apparatus as set forth in claim 12 wherein said plate/base alignment means further comprises means for laterally shifting said alignment plate relative to said transparent base.

14. Apparatus as set forth in claim 12 wherein said means for temporarily fixing further comprises vacuum suction means.

15. A method for passively aligning a pair of objects, comprising the steps of:
 (a) imprinting a set of fiducial marks on each object to be aligned;
 (b) imprinting a corresponding set of fiducial marks on a transparent alignment plate; and
 (c) aligning the objects to each other by carrying out the precision alignment of each object separately to its corresponding fiducial mark on said transparent alignment plate.

16. A method as set forth in claim 15 further comprising the steps of:
 (a) temporarily fixing, relative to said transparent alignment plate, the position of a pair of objects aligned in accordance with steps (a)–(c) of claim 15;
 (b) aligning said transparent alignment plate with respect to a mounting surface on which said pair of objects may be permanently mounted, utilizing a fiducial mark based alignment technique to align said plate and said mounting surface; and
 (c) permanently fixing said temporarily fixed pair of objects onto said mounting surface.

17. A method as set forth in claim 16 wherein said step of temporarily fixing further comprises the step of utilizing vacuum force to hold said pair of objects, aligned in accordance with steps (a)–(c) of claim 15, in a temporarily fixed position relative to said alignment plate.

18. A method as set forth in claim 16 wherein said step of permanently fixing said pair of objects to said mounting surface further comprises the steps of:
 (a) securing said temporarily fixed pair of objects to said mounting surface, after performing step (b) of claim 15; and
 (b) breaking said vacuum force once said pair of objects are secured to said mounting surface thereby leaving said pair of objects permanently affixed to said mounting surface and remaining in precise alignment with one another.

19. A method for passively aligning a pair of objects, each of which have fiducial marks imprinted thereon, comprising the steps of:
 (a) imprinting a corresponding set of fiducial marks on a transparent alignment plate; and
 (b) aligning the objects to each other by carrying out the precision alignment of each object separately to its corresponding fiducial mark on said transparent alignment plate.

20. A method as set forth in claim 19 further comprising the steps of:
 (a) temporarily fixing, relative to said transparent alignment plate, the position of a pair of objects claim 19,
 (b) aligning said transparent alignment plate with respect to a mounting surface on which said pair of objects may be permanently mounted, utilizing a fiducial mark based alignment technique to align said plate and said mounting surface; and
 (c) permanently fixing said temporarily fixed pair of objects onto said mounting surface.

21. A method as set forth in claim 20 wherein said step of temporarily fixing further comprises the step of utilizing vacuum force to hold said pair of objects, aligned in accordance with steps (a)–(b) of claim 19, in a temporarily fixed position relative to said alignment plate.

22. A method as set forth in claim 21 wherein said step of permanently fixing said pair of objects to said mounting surface further comprises the steps of:
 (a) securing said temporarily fixed pair of objects said mounting surface, after performing step (b) of claim 20; and
 (b) breaking said vacuum force once said pair of objects are secured to said mounting surface thereby leaving said pair of objects permanently affixed to said mounting surface and remaining in precise alignment with one another.

23. A method for passively aligning a pair of objects, each of which have fiducial marks imprinted thereon, utilizing a transparent alignment plate having a corresponding set of fiducial marks, imprinted thereon, comprising the steps of:
 (a) aligning the fiducial mark imprinted on one of the objects of said pair of objects to its corresponding fiducial mark imprinted on said transparent alignment plate; and
 (b) aligning the fiducial mark imprinted on the other object of said pair of objects to its corresponding fiducial mark imprinted on said transparent alignment plate, to thereby precisely align said pair of objects with respect to each other by carrying out the precision alignment of each object separately to its corresponding fiducial mark on said transparent alignment plate.

24. A method as set forth in claim 23 further comprising the steps of:

(a) temporarily fixing, relative to said transparent alignment plate, the position of a pair of objects aligned in accordance with steps (a)-(b) of claim 23;

(b) aligning said transparent alignment plate with respect to a mounting surface on which said pair of objects may be permanently mounted, utilizing a fiducial mark based alignment technique to align said plate and said mounting surface; and (c) permanently fixing said temporarily fixed pair of objects onto said mounting surface.

25. A method as set forth in claim 24 wherein said step of temporarily fixing further comprises the step of utilizing vacuum force to hold said pair of objects, aligned in accordance with steps (a)-(b) of claim 23, in a temporarily fixed position relative to said alignment plate.

26. A method as set forth in claim 24 wherein said step of permanently fixing said pair of objects to said mounting surface further comprises the steps of:

(a) securing said temporarily fixed pair of objects to said mounting surface, after performing step (b) of claim 24; and (b) breaking said vacuum force once said pair of objects are secured to said mounting surface thereby leaving said pair of objects permanently affixed to said mounting surface and remaining in precise alignment with one another.

27. A method for passively aligning pairs of objects using fiducial mark based alignment techniques, wherein at least one of said pairs of objects includes at least one object that is to be mounted onto a mounting surface, having a first plurality of fiducial marks imprinted thereon, in a flip-chip configuration, and further includes a fiducial mark imprint on said at least one object corresponding to one of a second plurality of fiducial marks located on a transparent base, comprising the steps of:

(a) aligning the fiducial mark imprinted on said at least one object with its corresponding fiducial mark on said transparent base;

(b) positioning said at least one object onto said transparent base;

(c) aligning at least one of said first plurality of fiducial marks imprinted on said transparent alignment plate with at least one of said second plurality of fiducial marks imprinted on said transparent base; and (d) temporarily fixing the position, relative to said alignment plate, of said at least one object positioned on said transparent base, to thereby facilitate mounting said at least one object on said mounting surface in said flip-chip configuration.

28. A method as set forth in claim 27 further comprising the step of laterally shifting said alignment plate relative to said transparent base.

29. A method as set forth in claim 27 wherein said step of temporarily fixing is achieved utilizing vacuum suction.

30. A method as set forth in claim 27 further comprising the step of aligning objects in the vertical direction utilizing said transparent alignment plate.

31. A method for precisely fixing a pair of objects to a mounting surface after the objects have been aligned in a precise mutual relationship, comprising the steps of:

(a) temporarily fixing, relative to fixture, the position of said pair of objects;

(b) aligning said fixture with respect to said mounting surface; and (c) permanently fixing said temporarily fixed pair of objects onto said mounting surface.

32. A method as set forth in claim 31 wherein said step of aligning is performed utilizing fiducial mark based alignment techniques.

33. A method as set forth in claim 31 wherein said fixture is a transparent alignment plate.

34. A method as set forth in claim 31 wherein said step of temporarily fixing further comprises the step of utilizing vacuum force to hold the pair of aligned objects in a temporarily fixed position relative to said fixture.

35. A method as set forth in claim 34 wherein said step of permanently fixing said pair of objects to said mounting surface further comprises the steps of:

(a) securing said temporarily fixed pair of objects to said mounting surface; and (b) breaking said vacuum force once said pair of objects are secured to thereby leave the pair of objects permanently fixed to said mounting surface, with the objects remaining in precise alignment with one another.

36. Apparatus for aligning a first object with a second object utilizing a combination of passive and active, fiducial mark based, alignment techniques, wherein said first object is permanently mounted on a mounting surface and said second object can be activated in response to an electric current, and further wherein the first and second objects have fiducial marks imprinted thereon, comprising:

(a) a transparent alignment plate having a plurality of imprinted fiducial marks corresponding to those fiducial marks on said first and second objects;

(b) means for optically aligning the fiducial marks on said first and second objects with the corresponding fiducial marks on said transparent alignment plate;

(c) means for temporarily fixing the second object of said pair of objects to said transparent alignment plate;

(d) means for applying an electrical potential to said second object; and (e) means for securing said second object to said mounting surface, wherein said means for securing, in a first state, permits adjusting the position of said second object on said mounting surface while placing said second object in contact with ground, and further wherein said means for securing, in a second state, permanently secures said second object to said mounting surface.

37. Apparatus as set forth in claim 36 wherein said means for applying an electrical potential comprises:

(a) a power source; and (b) a pair of contact electrical pads, with a first one of said pads being combined with said transparent alignment plate and coupled to said power source, and with a second one of said pads being combined with said second object, whereby said pair of electrical contact pads enable a current to flow through, and thereby activate, said second object whenever said pads are placed in contact with one another and said second object is coupled to ground.

38. Apparatus as set forth in claim 36 wherein said means for securing is solder.

39. Apparatus as set forth in claim 36 wherein said means for temporarily fixing employs vacuum suction to hold said second object to said transparent alignment plate.

40. Apparatus as set forth in claim 36 wherein said first object is a fiber carrier containing at least one optical fiber and said second object is a laser.

41. A batch fabrication process for fabricating laser-fiber modules, comprising the steps of:
   (a) fabricating a fiber carrier comprised of a plurality of optical fibers;
   (b) bonding said fiber carrier in proximity to a first end of a substrate;
   (c) sawing an array of slots into said substrate beginning at said first end, but not extending to a second, opposite end of said substrate, to thereby produce a comblike structure into which a given slot is positioned between two fibers with the second end of said substrate being left in tact;
   (d) aligning a laser bar, including a plurality of lasers, with respect to said fiber carrier;
   (e) bonding said laser bar to said substrate in proximity to said second end of said substrate and over the portion of said substrate left in tack after performing step (c);
   (f) wire bonding the individual lasers of said laser bar to corresponding electrical pads;
   (g) sawing off the intact end of said substrate so that the individual laser-fiber modules are held together only by said laser bar; and
   (h) separating said individual modules by cleaving said laser bar.

42. A process as set forth in claim 41 wherein said step of aligning is performed optically utilizing fiducial mark based alignment techniques.

43. A process as set forth in claim 41 wherein said step of fabricating includes the steps of positioning and bonding lensed fibers.

44. A process as set forth in claim 41 further comprising the step of hermetically sealing the laser-fiber modules prior to performing step (h).

45. A process as set forth in claim 41 wherein the emitting side of each laser is mounted adjacent to said substrate in a flip-chip configuration.

46. A process as set forth in claim 45 wherein a pedestal is inserted between said laser bar and said substrate to improve the thermal match between each laser and its supporting member.

47. A batch fabrication process for fabricating laser-fiber modules from a substrate that includes a fiber carrier, comprised of a plurality of optical fibers, located in proximity to a first end of said substrate, comprising the steps of:
   (a) sawing an array of slots into said substrate beginning at said first end, but not extending to a second, opposite end of said substrate, to thereby produce a comblike structure into which a given slot is positioned between two fibers with the second end of said substrate being left in tact;
   (b) aligning a laser bar, including a plurality of lasers, with respect to said fiber carrier;
   (c) bonding said laser bar to said substrate in proximity to said second end of said substrate and over the portion of said substrate left in tact after performing step (a);
   (d) wire bonding the individual lasers of said laser bar to corresponding electrical pads;
   (e) sawing off the intact end of said substrate so that the individual laser-fiber modules are held together only by said laser bar; and
   (f) separating said individual modules by cleaving said laser bar.

48. A process as set forth in claim 47 wherein said step of aligning is performed optically utilizing fiducial mark based alignment techniques.

49. A batch fabrication process for fabricating receiver-fiber modules from a substrate that includes a fiber carrier, comprised of a plurality of optical fibers, located in proximity to a first end of said substrate, comprising the steps of:
   (a) sawing an array of slots into said substrate beginning at said first end, but not extending to a second, opposite end of said substrate, to thereby produce a comblike structure into which a given slot is positioned between two fibers with the second end of said substrate being left in tact;
   (b) aligning a receiver bar, including a plurality of receivers, with respect to said fiber carrier;
   (c) bonding said receiver bar to said substrate in proximity to said second end of said substrate and over the portion of said substrate left in tact after performing step (a);
   (d) wire bonding the individual receivers of said receiver bar to corresponding electrical pads;
   (e) sawing off the intact end of said substrate so that the individual receiver-fiber modules are held together only by said receiver bar; and
   (f) separating said individual modules by cleaving said receiver bar.

50. A process as set forth in claim 49 wherein said step of aligning is performed optically utilizing fiducial mark based alignment techniques.

51. A method for aligning a first object with a second object utilizing a combination of passive and active, fiducial mark based, alignment techniques, wherein said first object is permanently mounted on a mounting surface and said second object can be activated in response to an electric current, and further wherein the first and second objects have fiducial marks imprinted thereon, comprising the steps of:
   (a) imprinting, on a transparent alignment plate, a plurality of fiducial marks corresponding to those fiducial marks on said first and second objects;
   (b) optically aligning the fiducial marks on said first and second objects with the corresponding fiducial marks on said transparent alignment plate;
   (c) temporarily fixing the second object of said pair of objects to said transparent alignment plate;
   (d) applying an electrical potential to said second object; and
   (e) securing said second object to said mounting surface with means for securing which, in a first state, permits adjusting the position of said second object on said mounting surface while placing said second object in contact with ground, and which in a second state, permanently secures said second object to said mounting surface.

52. A method as set forth in claim 51 wherein said first object is a fiber carrier containing at least one optical fiber and said second object is a laser.

* * * * *